(12) United States Patent
Seefeldt

(10) Patent No.: US 9,762,198 B2
(45) Date of Patent: Sep. 12, 2017

(54) FREQUENCY BAND COMPRESSION WITH DYNAMIC THRESHOLDS

(71) Applicant: DOLBY LABORATORIES LICENSING CORPORATION, San Francisco, CA (US)

(72) Inventor: Alan J. Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 14/787,854

(22) PCT Filed: Apr. 14, 2014

(86) PCT No.: PCT/US2014/034024
§ 371 (c)(1),
(2) Date: Oct. 29, 2015

(87) PCT Pub. No.: WO2014/179021
PCT Pub. Date: Nov. 6, 2014

(65) Prior Publication Data
US 2016/0072467 A1   Mar. 10, 2016

Related U.S. Application Data

(60) Provisional application No. 61/817,175, filed on Apr. 29, 2013.

(51) Int. Cl.
*H04B 15/00* (2006.01)
*H03G 5/16* (2006.01)
(Continued)

(52) U.S. Cl.
CPC ........... *H03G 5/165* (2013.01); *G10L 21/034* (2013.01); *G10L 25/18* (2013.01); *H03F 3/183* (2013.01);
(Continued)

(58) Field of Classification Search
None
See application file for complete search history.

(56) References Cited

U.S. PATENT DOCUMENTS 4,208,548 A   6/1980   Orban
4,249,042 A   2/1981   Orban
(Continued)

FOREIGN PATENT DOCUMENTS

CN   1627635   6/2005
CN   1856934   11/2006
(Continued)

OTHER PUBLICATIONS

Clifford, A. et al "Microphone Interference Reduction in Live Sound" Proc. of the 14th International Conference on Digital Audio Effects (DAFx-11), Paris, France, Sep. 19-23, 2011.
(Continued)

*Primary Examiner* — Joseph Saunders, Jr.
*Assistant Examiner* — James Mooney
(74) *Attorney, Agent, or Firm* — Roger Sampson; Weaver Austin Villeneuve & Sampson LLP

(57) ABSTRACT

Disclosed are examples of systems, apparatus, methods and computer-readable storage media for dynamically adjusting thresholds of a compressor. An input audio signal having a number of frequency band components is processed. Time-varying thresholds can be determined. A compressor performs, on each frequency band component, a compression operation having a corresponding time-varying threshold to produce gains. Each gain is applied to a delayed corresponding frequency band component to produce processed band components, which are summed to produce an output signal. In some implementations, a time-varying estimate of a perceived spectrum of the output signal and a time-varying estimate of a distortion spectrum induced by the perceived
(Continued)

spectrum estimate are determined, for example, using a distortion audibility model. An audibility measure of the distortion spectrum estimate in the presence of the perceived spectrum estimate can be predicted and used to adjust the time-varying thresholds.

20 Claims, 6 Drawing Sheets

(51) Int. Cl.
*H03G 9/00* (2006.01)
*H03G 9/02* (2006.01)
*H04R 3/04* (2006.01)
*G10L 25/18* (2013.01)
*G10L 21/034* (2013.01)
*H03F 3/183* (2006.01)
*H03G 3/30* (2006.01)
*H04R 29/00* (2006.01)

(52) U.S. Cl.
CPC ........... *H03G 3/3005* (2013.01); *H03G 9/005* (2013.01); *H03G 9/025* (2013.01); *H04R 3/04* (2013.01); *H04R 29/008* (2013.01); *H03F 2200/03* (2013.01)

(56) References Cited

U.S. PATENT DOCUMENTS

| | | | |
|---|---|---|---|
| 5,483,600 A | 1/1996 | Werrbach | |
| 5,832,444 A | 11/1998 | Schmidt | |
| 6,108,431 A | 8/2000 | Bachler | |
| 6,618,486 B2 | 9/2003 | Orban | |
| 7,181,034 B2 | 2/2007 | Armstrong | |
| 7,309,829 B1 | 12/2007 | Ludwig | |
| 8,090,120 B2 | 1/2012 | Seefeldt | |
| 8,199,933 B2 | 6/2012 | Seefeldt | |
| 8,271,276 B1 | 9/2012 | Muesch | |
| 8,521,314 B2 | 8/2013 | Seefeldt | |
| 8,577,676 B2 | 11/2013 | Muesch | |
| 9,083,298 B2 | 7/2015 | Seefeldt | |
| 2003/0223597 A1 | 12/2003 | Puria | |
| 2005/0123153 A1 | 6/2005 | Toki | |
| 2009/0254339 A1 | 10/2009 | Seguin | |
| 2010/0076769 A1* | 3/2010 | Yu | G10L 19/0204 704/269 |
| 2010/0215193 A1 | 8/2010 | Wihardja | |
| 2011/0255712 A1 | 10/2011 | Urata | |
| 2013/0046546 A1 | 2/2013 | Uhle | |
| 2013/0142360 A1* | 6/2013 | Potard | H03G 9/18 381/98 |

FOREIGN PATENT DOCUMENTS

| | | |
|---|---|---|
| CN | 101036293 | 9/2007 |
| EP | 0591441 | 4/1994 |
| EP | 0986933 | 3/2002 |
| EP | 1251715 | 10/2002 |
| GB | 1385493 | 2/1975 |
| JP | 2003-520469 | 7/2003 |
| JP | 2005-160038 | 6/2005 |
| JP | 2010-521715 | 6/2010 |
| SU | 1223285 | 4/1986 |
| WO | 2008/057173 | 5/2008 |
| WO | 2008/106036 | 9/2008 |

OTHER PUBLICATIONS

Enderby, S. et al "Harmonic Instability of Digital Soft Clipping Algorithms" Proc. of the 15th Int. Conference on Digital Audio Effects (DAFx-11), York, UK, Sep. 17-21, 2012.

Vickers, Earl "The Loudness War: Background, Speculation and Recommendations" AES 129th Convention, San Francisco, CA, USA, Nov. 4-7, 2010.

Cassidy, R.J. et al., "A Tunable, Nonsubsampled, Non-Uniform Filter Bank for Multi-Band Audition and Level Modification of Audio Signals" Conference Record of the Thirty-Eight Asilomar Conference on Signals, Systems and Computers IEEE, 2004, vol. 2, 2228-2232.

* cited by examiner

FREQUENCY BAND COMPRESSION WITH DYNAMIC THRESHOLDS

CROSS-REFERENCE TO RELATED APPLICATIONS

This patent application claims priority to and commonly assigned U.S. Provisional Patent Application No. 61/817,175, titled "Distortion Reducing Multi-band Compressor with Dynamic Thresholds based on a Distortion Audibility Model", by Alan J. Seefeldt, filed on Apr. 29, 2013, hereby incorporated by reference in its entirety for all purposes.

TECHNICAL FIELD

This patent disclosure generally relates to audio presentation and, in particular, to distortion reduction during presentation.

BACKGROUND

Some audio playback devices such as smartphones and tablets include amplifiers and speakers with limited output capabilities. In such devices, audio playback can be perceptibly distorted, and often acutely distorted, as playback level is increased during presentation. The characteristics of distortion are often frequency-dependent for a playback device. For example, a television cabinet may exhibit a resonance response at a specific frequency that is excited when an output signal at the specific frequency reaches or exceeds a particular level, resulting in an annoying rattle.

Multi-band compression can be applied to an audio signal before playback to reduce distortion and attempt to maximize playback level on a playback device. A distortion threshold is specified for each frequency band of the signal. The compressor applies an independent gain to each band to ensure that the signal level in each band does not exceed the corresponding distortion threshold.

SUMMARY

Disclosed are some examples of systems, apparatus, methods and computer-readable storage media implementing techniques for dynamically adjusting thresholds of a compressor responsive to an input audio signal. In some implementations, an input signal having a number of frequency band components is processed. Time-varying thresholds can be determined according to the frequency band components. Each time-varying threshold generally corresponds to a respective frequency band component. A compressor performs, on each frequency band component, a compression operation having the corresponding time-varying threshold to produce a number of gains, where each gain corresponds to a respective frequency band component. Each gain is applied to a delayed corresponding frequency band component to produce a number of processed band components, which are summed to produce an output signal.

In some implementations, a time-varying estimate of a perceived spectrum of the output signal is determined. Also, a time-varying estimate of a distortion spectrum induced by the perceived spectrum estimate is determined, for example, according to a response of a distortion model. An audibility measure of the distortion spectrum estimate in the presence of the perceived spectrum estimate is predicted. The time-varying thresholds can be adjusted according to the predicted audibility measure.

In some implementations, predicting the audibility measure includes: computing a masking threshold from the perceived spectrum estimate; determining differences between the distortion spectrum estimate and the masking threshold; and summing positive values of the determined differences to produce the predicted audibility measure. The masking threshold can be computed with reference to a tonality spectrum based on the perceived spectrum estimate. The tonality spectrum includes tonality values differentiating noise-like frequency band components from tone-like frequency band components. The summed positive values of the determined differences can be weighted such that one or more upper frequency band components and one or more lower frequency band components have lower weights than a frequency band component between the upper and lower band components.

In some implementations, the time-varying thresholds are determined at least in part according to fixed nominal thresholds. Thus, each time-varying threshold can be determined according to a corresponding frequency band component and according to a respective fixed threshold. In these implementations, a predicted audibility measure of distortion can be normalized. The time-varying thresholds can be raised or lowered with reference to one or more fixed thresholds and according to the normalized audibility measure as applied to an offset value.

In some implementations, apparatus for dynamically adjusting compression thresholds responsive to an input audio signal includes one or more controllers operable to cause some or all of the operations described above to be performed. In addition, such apparatus can include a filtering module capable of filtering the input signal to produce the frequency band components, as well as a multi-band filter including a number of bandpass filters, where each bandpass filter corresponds to a respective frequency band component. The apparatus can also include one or more amplifiers coupled to receive and amplify the output signal to produce an amplified output signal, and one or more speakers coupled to receive and play the amplified output signal.

In some implementations, a non-transitory computer-readable storage medium stores instructions executable by a computing device to cause some or all of the operations described above to be performed. Non-limiting examples of computing devices include servers and desktop computers, as well as portable handheld devices such as a smartphone, a tablet, a laptop, a portable music player, etc. In some instances, one or more servers can be configured to process an input audio signal using one or more of the disclosed techniques and stream the processed output signal to a user's device over the Internet as part of a cloud-based service.

BRIEF DESCRIPTION OF THE FIGURES

The included Figures are for illustrative purposes and serve only to provide examples of possible structures and operations for the disclosed inventive systems, apparatus, methods and computer-readable storage media. These drawings in no way limit any changes in form and detail that may be made by one skilled in the art without departing from the spirit and scope of the disclosed implementations.

DETAILED DESCRIPTION

Disclosed are some examples of systems, apparatus, methods and computer-readable storage media implementing techniques for dynamically adjusting thresholds of a compressor responsive to an input audio signal. Some of the disclosed techniques incorporate a distortion audibility model to determine dynamic thresholds, which can be applied by a multi-band compressor. The distortion audibility model is configured to predict, in a dynamic signal-dependent manner, the perceived audibility of the distortion induced by an input signal in the presence of that input signal. This predicted audibility can be used to dynamically modify the thresholds of the compressor. Some devices and systems incorporating the disclosed techniques are thus capable of increased playback levels with minimal perceived distortion.

In some implementations, the distortion audibility model is configured to predict a time-varying estimate of the signal spectrum heard by a listener as well as a time-varying estimate of the distortion spectrum induced by that signal. The distortion audibility model then predicts the audibility of this distortion spectrum estimate in the presence of the signal spectrum estimate. In this way, one or more time-varying thresholds of the compressor can be dynamically modulated accordingly.

The disclosed techniques for dynamic adjustment of compression thresholds may be used in conjunction with other compression processes and can be implemented in various devices and systems such as smartphones, tablets, laptop computers, portable music players, televisions, monitors, and server-based systems.

Some devices and systems implementing the disclosed techniques improve upon conventional multi-band compressors, which noticeably alter timbre, an attribute of listener perception where two sounds of equal loudness and pitch can be perceived as dissimilar. When certain frequencies reach a distortion threshold and others do not, some conventional compressors introduce disadvantages by altering relative balance among these frequencies. The resulting sound emerges as aberrant, resulting in an unnatural hearing experience.

In addition, if gains are overly aggressive, playback level can be unnecessarily reduced. If the threshold in each band is set to eliminate perceived distortion for a narrowband signal centered at that band, then the attenuation resulting from a broadband signal passing through the compressor is often more than is required to perceptually eliminate any induced distortion. This is due to the fact that the broadband signal may significantly mask some of the distortion which the broadband signal induces, whereas a narrowband signal may be much less effective at masking its induced distortion.

Figure 1:
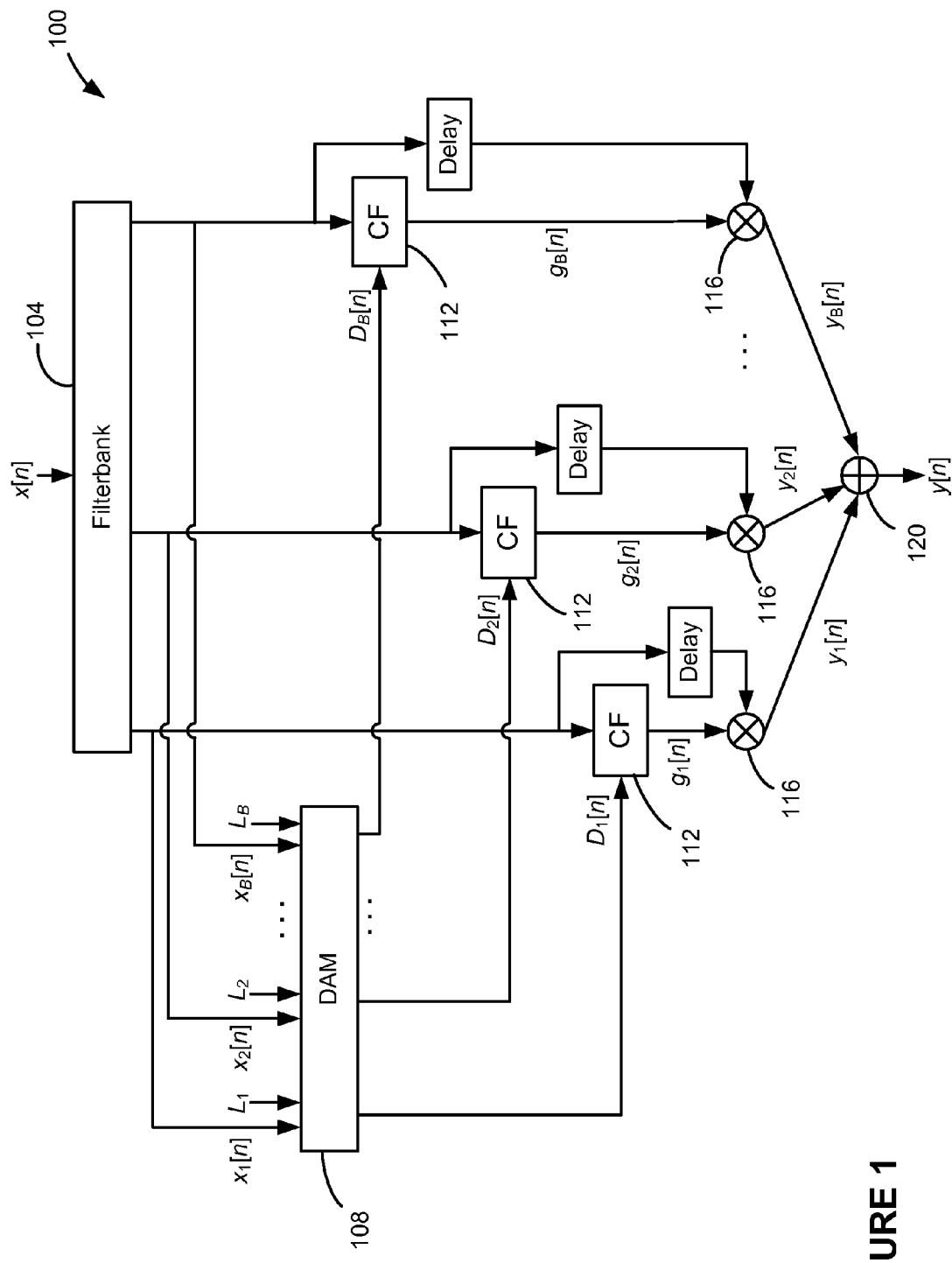
FIG. 1 shows an example of a compressor 100 incorporating a distortion audibility model (DAM) for dynamically adjusting thresholds of the compressor responsive to an input audio signal, according to some implementations.

FIG. 1 shows an example of a compressor 100 incorporating a distortion audibility model (DAM) for dynamically adjusting thresholds of the compressor responsive to an input audio signal, according to some implementations. In FIG. 1, a filtering module in the form of a filterbank 104 receives an input audio signal x[n]. Filterbank 104 is configured to filter input signal x[n] to separate input signal x[n] into a number of frequency band components $x_1[n]$-$x_B[n]$. In some implementations, filterbank 104 is configured as a multi-band filter implemented as a number B of bandpass filters, where each bandpass filter corresponds to a respective frequency band component. For example, each band b of filterbank 104 can be configured to output a frequency band component $x_b[n]$ computed as input signal x[n] convolved with a bandpass filter response $h_b[n]$ as represented in Equation 1:

$$x_b[n] = h_b[n] * x[n], \; b=1 \ldots B \tag{1}$$

In FIG. 1, a DAM 108 has inputs coupled to receive frequency band components $x_1[n]$-$x_B[n]$ output from filterbank 104. Each frequency band component $x_b[n]$ provided to DAM 108 is paired with a respective fixed compression threshold $L_b$ as shown in FIG. 1. DAM 108 is configured to compute and output time-varying thresholds $D_1[n]$-$D_B[n]$. In some implementations, each time-varying threshold $D_b[n]$ is computed as a function of a respective frequency band component $x_b[n]$. In some other implementations, rather than being computed independently for each band, each time-varying threshold $D_b[n]$ is computed as a function of all frequency band components $x_1[n]$-$x_B[n]$ and fixed thresholds $L_b$ across bands $b=1 \ldots B$ as represented in Equation 2:

$$D_b[n] = DAM(\{x_i[n], L_i | i=1 \ldots B\}) \tag{2}$$

Each frequency band component $x_b[n]$ is provided as an input to a compression function (CF) $112_b$ along with a respective time-varying threshold $D_b[n]$ representing the level above which a signal in that band b will begin to produce distortion. Each compression function $112_b$ is configured to process frequency band component $x_b[n]$ and time-varying threshold $D_b[n]$ to produce a time varying gain $g_b[n]$, which represents the gain to keep band b below its limit threshold $L_b$, as represented in Equation 3:

$$g_b[n] = CF(x_b[n], D_b[n]) \tag{3}$$

A processed output signal y[n] is computed by summing delayed versions of all of frequency band components $x_1[n]$-$x_B[n]$ multiplied with their corresponding gain signals $g_1[n]$-$g_B[n]$. In FIG. 1, multiplier units 116 are configured to multiply gain signals with delayed frequency band components, $y_b[n] = g_b[n]x_b[n-d]$, to produce processed band components $y_1[n]$-$y_B[n]$, which are then summed at a summing unit 120 to produce output signal y[n]. For example, a delay d can be designed to take into account any processing delay associated with the computation of the gain signals. Equation 4 shows a representation of the generation of processed signal y[n]:

$$y[n] = \sum_{b=1}^{B} g_b[n] x_b[n-d] \quad (4)$$

Figure 2:
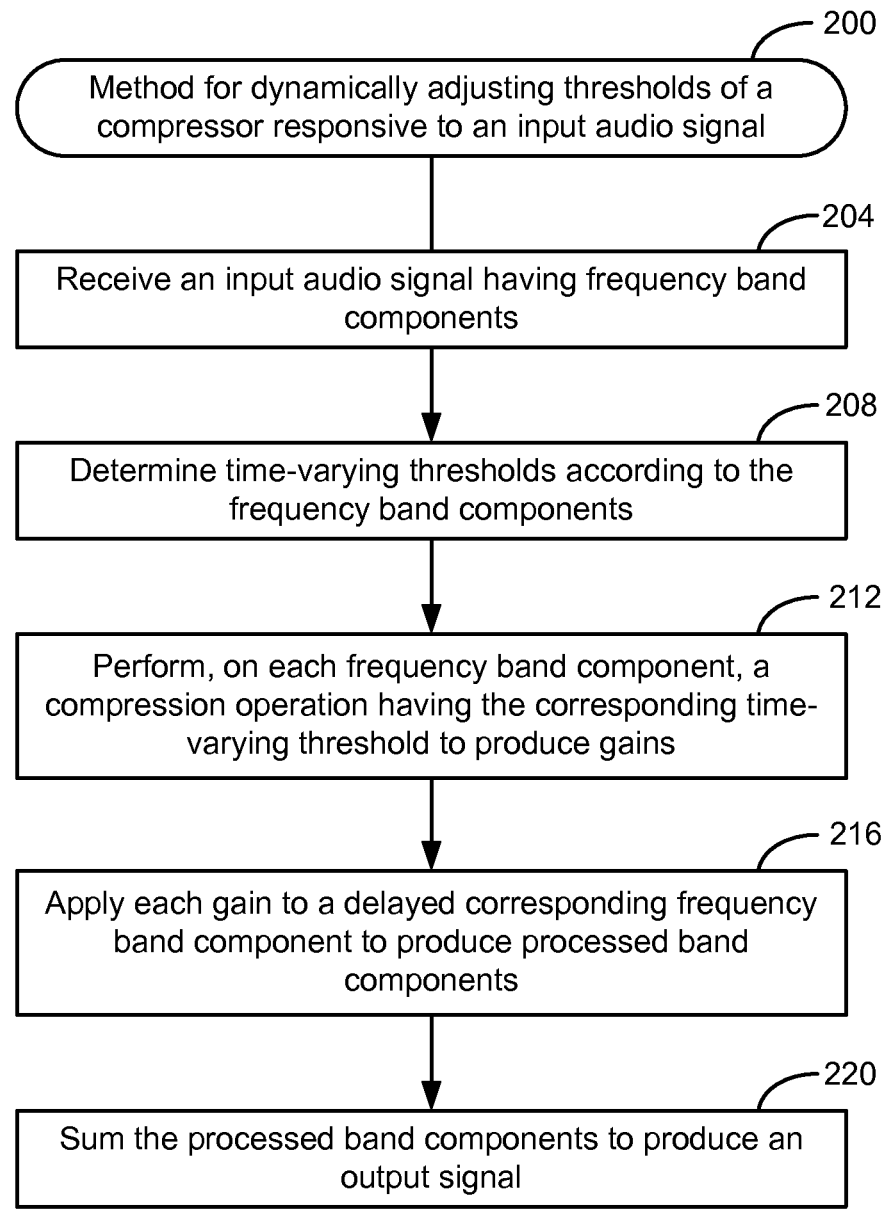
FIG. 2 shows an example of a method 200 for dynamically adjusting thresholds of a compressor responsive to an input audio signal, performed according to some implementations.

FIG. 2 shows an example of a method 200 for dynamically adjusting thresholds of a compressor responsive to an input audio signal, performed according to some implementations. FIG. 2 is described with reference to the example of FIG. 1. At 204 of FIG. 2, frequency band components $x_1[n]$-$x_B[n]$ are received as inputs to DAM 108, as explained above. At 208, DAM 108 determines time-varying thresholds $D_1[n]$-$D_B[n]$ according to frequency band components $x_1[n]$-$x_B[n]$. At 212, each CF $112_b$ is configured to perform a compression operation on corresponding frequency band component $x_b[n]$ using corresponding time-varying threshold $D_b[n]$ to produce gains $g_1[n]$-$g_B[n]$. At 216, each gain $g_b[n]$ is applied to a delayed version of a corresponding frequency band component $x_b[n]$, for instance, using multiplier units 116, to produce processed band components $y_1[n]$-$y_B[n]$. At 220, processed band components $y_1[n]$-$y_B[n]$ are summed at summing unit 120 to produce output signal $y[n]$, which can then be stored in a memory device and/or provided to additional processing modules.

Figure 3:
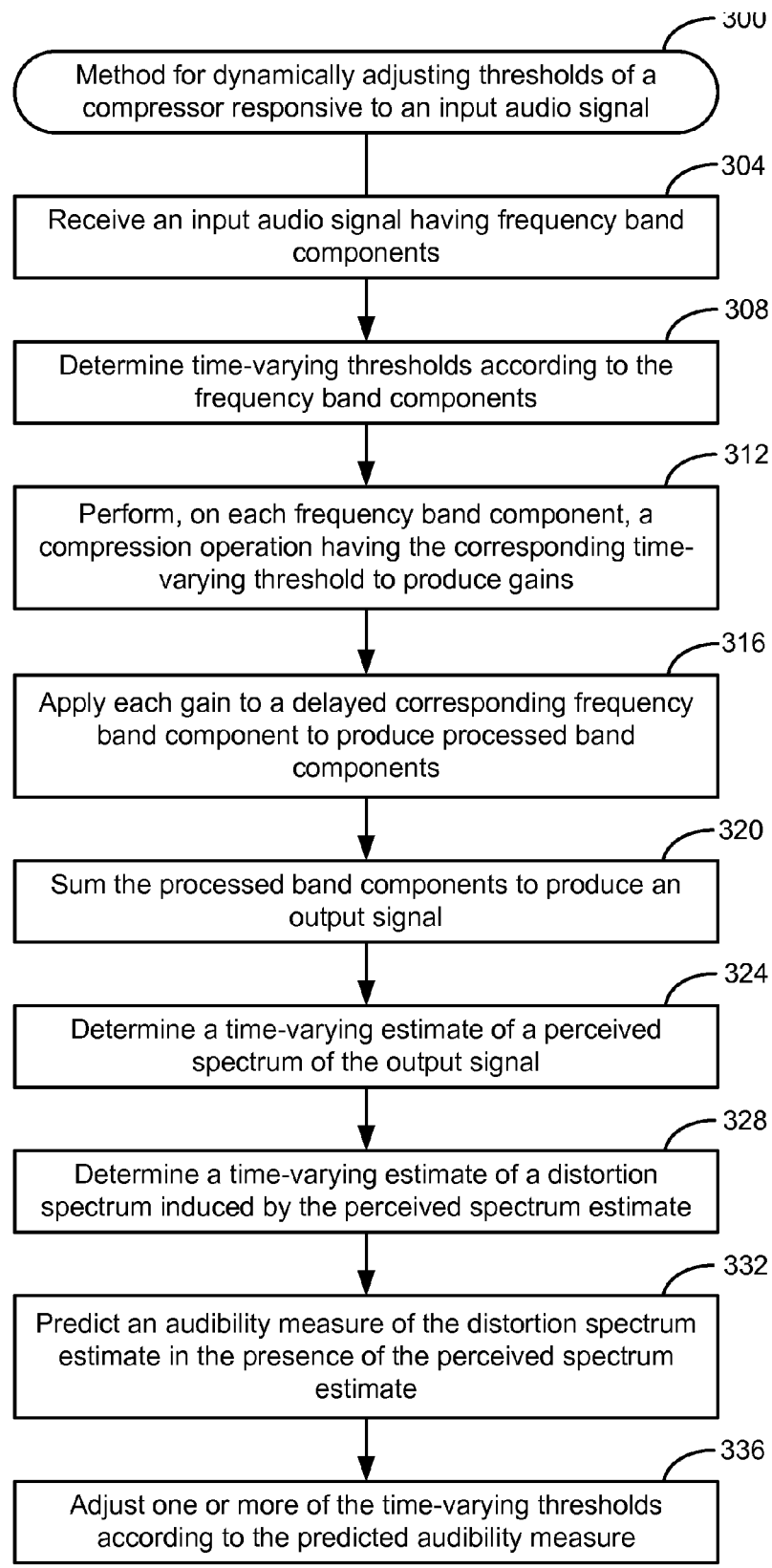
FIG. 3 shows another example of a method 300 for dynamically adjusting thresholds of a compressor responsive to an input audio signal, performed according to some implementations.

FIG. 3 shows another example of a method 300 for dynamically adjusting thresholds of a compressor responsive to an input audio signal, performed according to some implementations. Operations 304-320 of method 300 are substantially the same as operations 204-220 of method 200 described above. In FIG. 3, following the generation of output signal $y[n]$, at 324, a time-varying estimate of the power spectrum of output signal $y[n]$ as heard by a listener can be estimated. To this end, a smoothing operation can be applied to processed band components $y_1[n]$-$y_B[n]$. For instance, each processed band component, $y_b[n]=g_b[n]x_b[n-d]$, can be smoothed with a fast-attack/slow-release one pole smoother. $s_b[n]$ represents the estimate of the output signal spectrum perceived by a listener, and is calculated in Equation 5:

$$s_b[n] = \begin{cases} \alpha_A s_b[n-1] + (1-\alpha_A) y_b^2[n], & y_b^2[n] \geq s_b[n-1] \\ \alpha_R s_b[n-1] + (1-\alpha_R) y_b^2[n], & \text{otherwise} \end{cases} \quad (5)$$

To reduce artifacts arising from the subsequent modulation of the compression thresholds, in some instances it may be desirable to utilize a slightly faster attack and slightly slower release time than those used in Equation 5 for governing the attack and release of gains $g_1[n]$-$g_B[n]$. In such instances, the estimated output signal spectrum perceived by a listener can be represented in decibels (dB), as shown in Equation 6:

$$S_b[n] = 10 \log_{10}(s_b[n]) \quad (6)$$

In FIG. 3, at 328, a time-varying estimate of a distortion spectrum induced by the perceived spectrum estimate $s_b[n]$ is determined. For example, the distortion induced in a playback system by $s_b[n]$ can be estimated by feeding $s_b[n]$ into a model of distortion generation. Such a model may be generated by measuring and characterizing an individual playback system. In some cases, a generalized model for devices with small speakers is adequate and assumes that a signal in a band b will induce distortion into all bands including and above b at a level some fixed offset below the signal level in band b.

In some implementations, the distortion spectrum estimate in any given band is given by the maximum over all bands of the distortion generated into that band. Thus, a first estimated distortion of a first frequency band component can be determined as a maximum of distortion induced into the first frequency band component and into at least a portion of the frequency band components of higher frequency than the first frequency band component. This is because any single band generally produces distortion into bands including and above itself. The distortion spectrum estimates $D_1[n]$-$D_B[n]$, serving as time-varying thresholds as described above in relation to FIGS. 1 and 2, may be computed in a sequential manner starting from the lowest band to the highest as illustrated in Equation 7, where an example of a value for fixed offset $D_{offset}$ is 40 dB:

$$D_1[n] = S_1[n] - D_{offset}$$

$$D_b[n] = \max\{D_{b-1}[n], S_b[n] - D_{offset}\} \quad b=2 \ldots B \quad (7)$$

Figure 4:
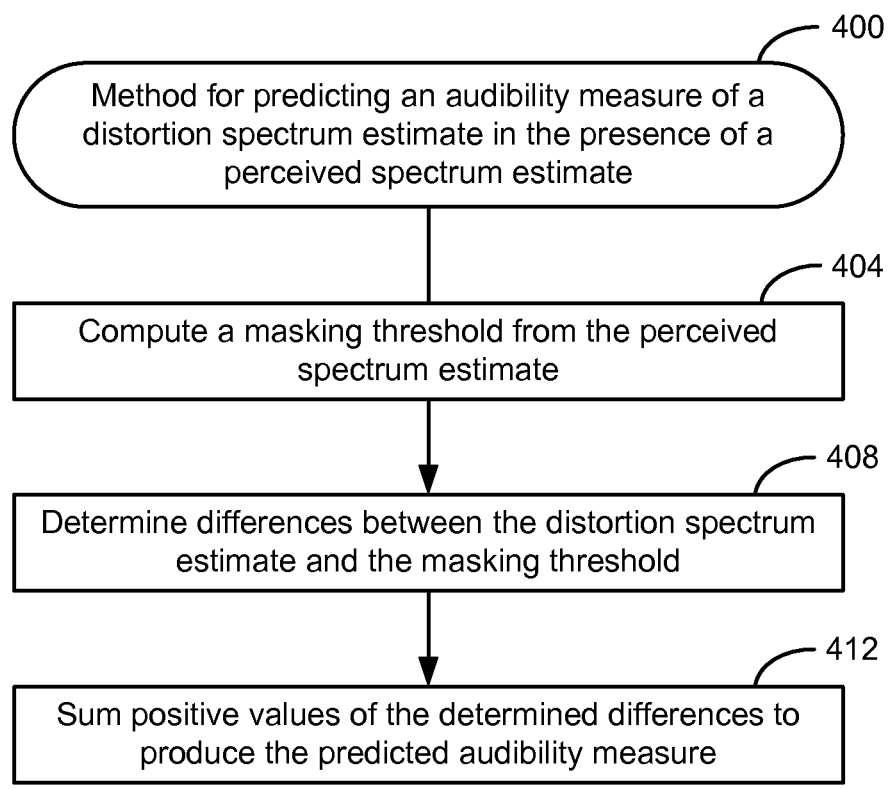
FIG. 4 shows an example of a method 400 for predicting the audibility measure of a distortion spectrum estimate in the presence of a perceived spectrum estimate, performed according to some implementations.

In FIG. 3, at 332, an audibility measure of the distortion spectrum estimate $D_b[n]$ in the presence of the perceived spectrum estimate $s_b[n]$ is predicted, for instance, using DAM 108 of FIG. 1. FIG. 4, as described below, shows an example of a technique for predicting this audibility measure.

In FIG. 3, at 336, one or more of the time-varying thresholds are adjusted according to a predicted audibility measure $A[n]$. In some implementations, predicted audibility measure $A[n]$ is normalized, and one or more of time-varying thresholds $D_b[n]$ are raised or lowered with reference to one or more of fixed thresholds $L_b$ and according to the normalized audibility measure as applied to an offset value. For example, a predicted audibility measure can be normalized between zero and one before being utilized to modulate time-varying thresholds $D_1[n]$-$D_B[n]$ as illustrated in Equation 8:

$$A_{norm}[n] = \begin{cases} 0 & A[n] < A_{low} \\ \dfrac{A[n] - A_{low}}{A_{high} - A_{low}} & A_{low} < A[n] < A_{high} \\ 1 & A_{high} < A[n] \end{cases} \quad (8)$$

In the example of equation 8, normalization limits are chosen such that when normalized predicted audibility measure $A_{norm}[n]$ equals zero, the induced distortion is well masked by the output signal, and when $A_{norm}[n]$ equals one, the distortion is at the edge of audibility. Therefore, when $A_{norm}[n]$ equals zero, time-varying thresholds $D_1[n]$-$D_B[n]$ can be raised to allow louder playback, but when $A_{norm}[n]$ equals one, thresholds $D_1[n]$-$D_B[n]$ remain at their nominal values. As such, thresholds $D_1[n]$-$D_B[n]$ can be computed from fixed thresholds $L_b$ according to:

$$D_b[n] = L_b + (1 - A_{norm}[n]) L_{offset} \quad (9)$$

In equation 9, a threshold $D_b[n]$ is raised by $L_{offset}$ dB above its nominal value when $A_{norm}[n]$ equals zero. In one case, setting $L_{offset}$ in the range of 6 dB yielded a perceptually substantial increase in perceived loudness for broadband signals without a perceived increase in distortion. In other cases, $L_{offset}$ was tailored to a particular playback device.

FIG. 4 shows an example of a method 400 for predicting the audibility measure of a distortion spectrum estimate in the presence of a perceived spectrum estimate, performed according to some implementations. At 404, a masking threshold $M_b[n]$ is computed from perceived spectrum estimate $s_b[n]$. One model for masking threshold $M_b[n]$ is a fixed offset, $M_{offset}$, below the perceived spectrum estimate, as shown in equation 10, in which an example of a value for $M_{offset}$ is 10 dB:

$$M_b[n]=S_b[n]-M_{offset} \qquad (10)$$

Alternatively, a masking model may be used which takes into account the variability of masking as a function of the tonality of a masking signal. It is generally known that the masking ability of a tone-like signal is significantly less than a noise-like signal. Thus, masking threshold $M_b[n]$ can be computed with reference to a tonality spectrum based on $s_b[n]$. The tonality spectrum includes tonality values differentiating noise-like frequency band components from tone-like frequency band components. One may characterize the tonality of $s_b[n]$ in each band using known techniques to generate a tonality spectrum $T_b[n]$, where $T_b[n]$ varies from zero to one. Zero indicates a noise-like signal and one represents a tone-like signal. Utilizing this tonality spectrum, the masking threshold may be computed as represented in Equation 11:

$$M_b[n]=S_b[n]-(T_b[n]M_{tone}+(1-T_b[n])M_{noise}) \qquad (11)$$

In one test case, $M_{tone}=30$ dB and $M_{noise}=10$ dB were examples of appropriate values, yielding 20 dB less masking for tonal signals than noise-like signals.

In FIG. 4, at 408, distortion spectrum estimate $D_b[n]$ is compared with masking threshold $M_b[n]$ across the bands to determine any differences between $D_b[n]$ and $M_b[n]$. At 412, any positive values of the determined differences are summed to produce predicted audibility measure $A[n]$. In some implementations, $A[n]$ is computed as a weighted sum of the positive values of the differences between $D_b[n]$ and $M_b[n]$, as shown in Equation 12:

$$A[n] = \sum_b W_b \max\{D_b[n] - M_b[n], 0\} \qquad (12)$$

In equation 12, in some implementations, the weighting $W_b$ may be perceptually motivated with high and low frequency bands weighted less than middle frequency bands.

In some other implementations, rather than utilizing an explicit distortion generation and masking model, a measure of the distortion audibility may instead be inferred from a function of signal spectrum $S_b[n]$. One such example is the standard deviation of this spectrum across bands, as illustrated in equation 13:

$$A[n] = \sqrt{\frac{1}{B}\sum_b \left(S_b[n] - \frac{1}{B}\sum_i S_i[n]\right)^2} \qquad (13)$$

When the standard deviation is low, the value of all bands is roughly the same, meaning $S_b[n]$ is roughly broadband. In this case $S_b[n]$ should mask distortion reasonably well. If the standard deviation is relatively high, the values of $S_b[n]$ are varying significantly to indicate possible "holes" in the spectrum through which distortion will be audible. As a result, the value $A[n]$ in equation 13 matches very roughly the behavior of that in equation 12. The audibility value from equation 13 may then be normalized according to equation 8, with normalization limits different than the ones used with distortion generation and masking model, and then utilized as in equation 9 to modulate thresholds $D_b[n]$.

Figure 5:
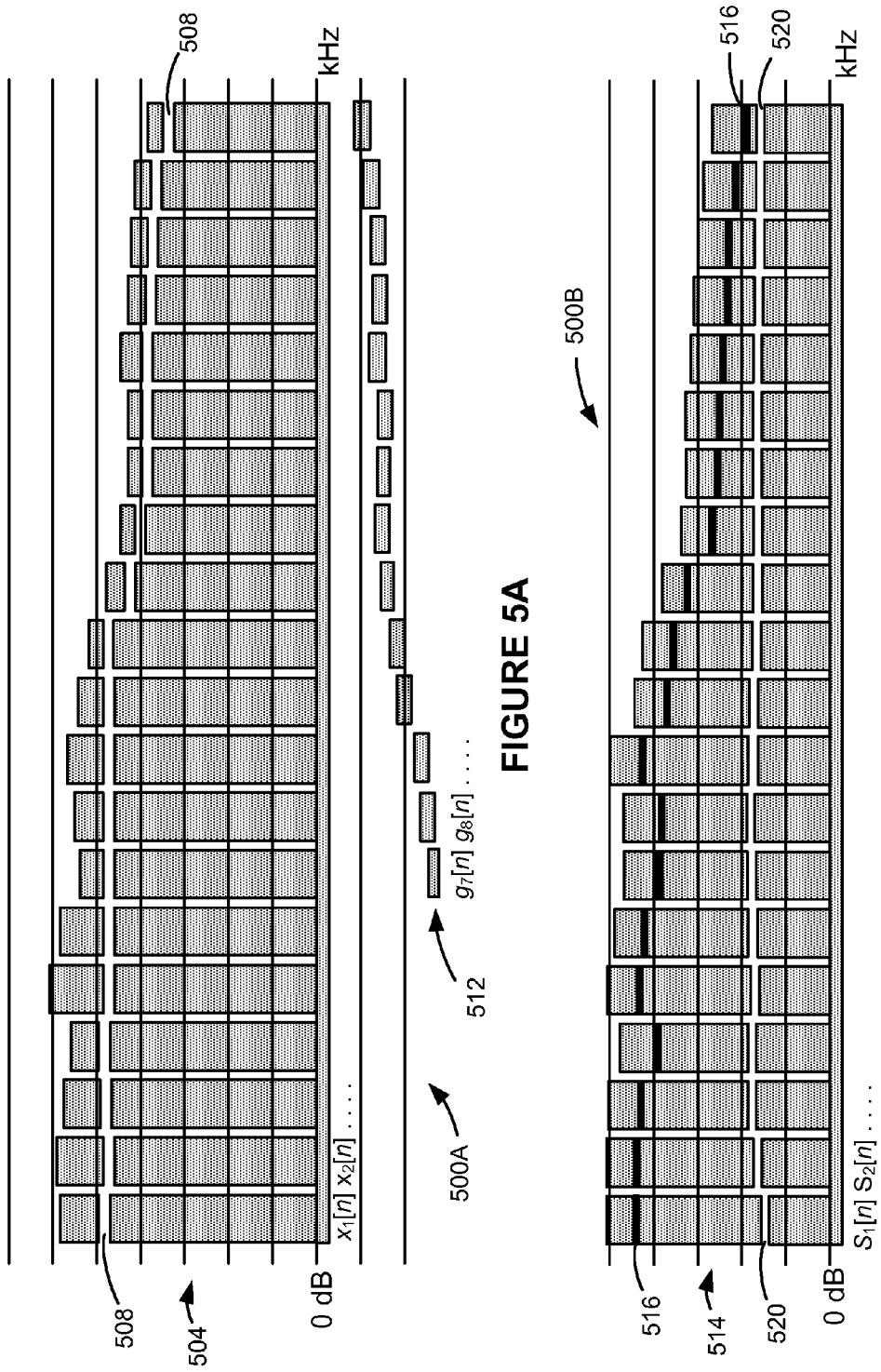
FIG. 5A shows an example of a graphical representation 500A of energy levels of frequency band components of an input audio signal, as displayed on a display device, according to some implementations.
FIG. 5B shows an example of a graphical representation 500B of corresponding energy levels of an estimated output signal spectrum perceived by a listener, as displayed on a display device, according to some implementations.

FIG. 5A shows an example of a graphical representation 500A of energy levels of frequency band components of an input audio signal, as displayed on a display device, according to some implementations. FIG. 5B shows an example of a graphical representation 500B of corresponding energy levels of an estimated output signal spectrum perceived by a listener, as displayed on a display device, according to some implementations.

In the examples of FIGS. 5A and 5B, compressor 100 of FIG. 1 processes an input audio signal $x[n]$ as described above. In FIG. 5A, twenty frequency band components $x_1[n]$-$x_{20}[n]$ of the input signal are generated by filterbank 104 of FIG. 1 and are spaced to mimic perceptual resolution of human hearing. The signal energies of each frequency band component $x_b[n]$ feeding compression functions 112 of FIG. 1 are represented by bars 504 in FIG. 5A. Time-varying thresholds $D_1[n]$-$D_{20}[n]$ for each frequency band component, calculated as described above, are represented by clear segments 508. Gains $g_1[n]$-$g_{20}[n]$ output from compression functions 112 are depicted by segments 512.

In FIG. 5B, energy levels of a perceived spectrum estimate $S_1[n]$-$S_{20}[n]$ are represented by bars 514. Masking thresholds $M_1[n]$-$M_{20}[n]$ computed from a perceived spectrum estimate $s_b[n]$ as described above are represented in FIG. 5B by segments 516. Time-varying thresholds $D_1[n]$-$D_2[n]$ generated by DAM 108 of FIG. 1 are represented by clear segments 520 in FIG. 5B. In FIG. 1, DAM 108 increases time-varying thresholds $D_1[n]$-$D_{20}[n]$ 520 of FIG. 5B to maximum possible levels before any induced distortion would be perceived by a listener in the presence of the audio signal playing through compressor 100. In general, for broadband signals, time-varying thresholds $D_1[n]$-$D_{20}[n]$ will be increased above their nominally set levels $L_b$ since the signal itself will mask a significant portion of any induced distortion. For narrowband signals, the time-varying thresholds would likely remain near their nominal levels since the signal would offer little masking of any induced distortion.

Figure 6:
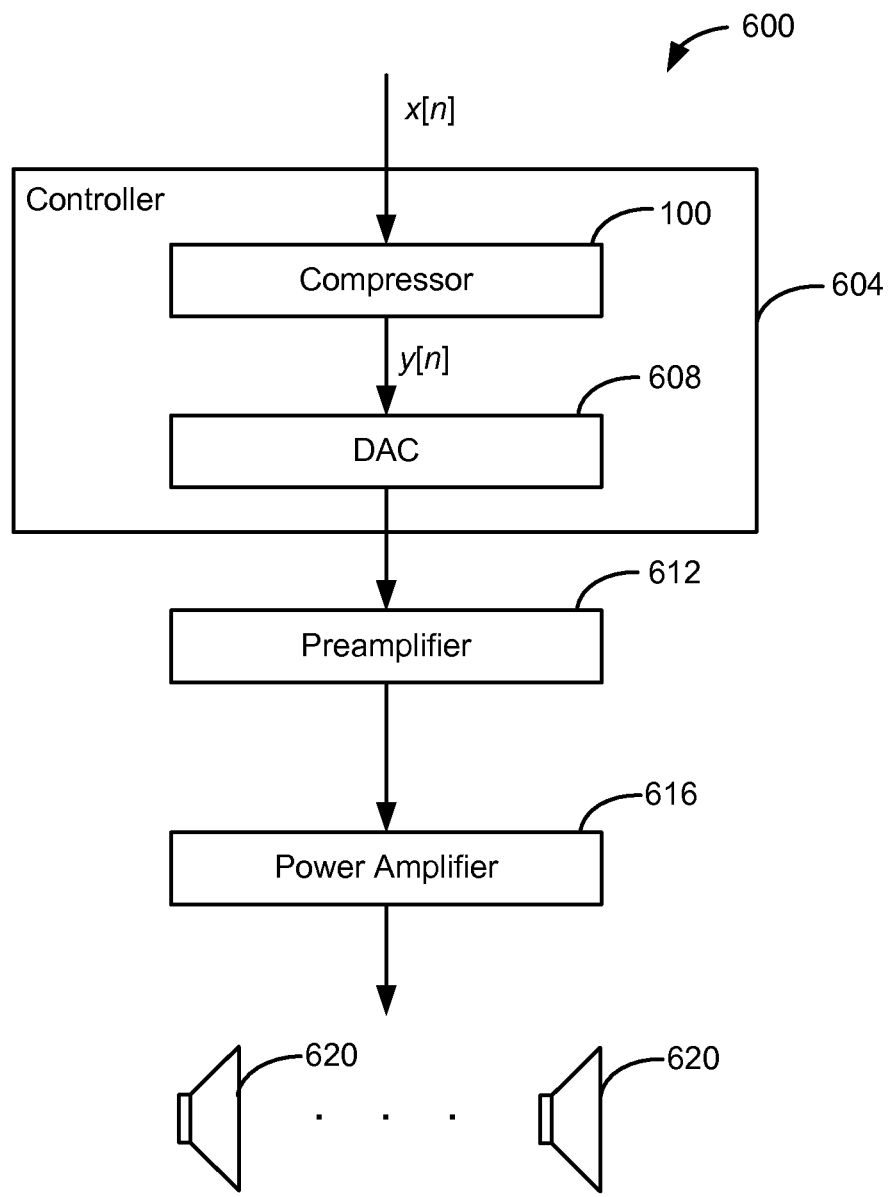
FIG. 6 shows an example of a playback system 600 incorporating a compressor 100 for presenting an audio signal, according to some implementations.

FIG. 6 shows an example of a playback system 600 incorporating a compressor 100 for presenting an audio signal, according to some implementations. In FIG. 6, a controller 604 is configured to implement compressor 100 as described above. For example, one or more of the operations described above with reference to FIGS. 2-4 can be performed or caused to be performed by controller 604. Controller 604 can have a wide variety of different configurations, as explained in greater detail below. In addition, controller 604 can be implemented on a user device as in the case of FIG. 6 or, in some cases, on one or more servers.

In an alternative example to that shown in FIG. 6, a server implementing controller 604 can stream audio to a user's device over a suitable network. Those skilled in the art should appreciate that such a network provides communication between servers and user devices, such as a smartphone or a tablet. The network can be any subset or combination of a wide variety of network environments including, for example, TCP/IP-based networks, telecommunications networks, wireless networks, cable networks, public networks, private networks, wide area networks, local area networks, the Internet, the World Wide Web, intranets, extranets, etc.

Returning to FIG. 6, playback system 600 includes a digital-to-analog converter (DAC) 608 coupled to receive output signal $y[n]$ from compressor 100 and convert $y[n]$ to an analog signal. While DAC 608 is implemented as one processing module of controller 604 in this example, those skilled in the art should appreciate that DAC 608 can be constructed as a separate unit from controller 604 and, in some instances, as a separate device from a server or user's device in which controller 604 is situated.

In FIG. 6, a preamplifier 612 is coupled to receive and boost the signal strength of the analog signal output by DAC 608. Various types of preamplifiers can be used such as current-sensitive preamplifiers, parasitic-capacitance preamplifiers, charge-sensitive preamplifiers, or some combination thereof. Those skilled in the art should appreciate that preamplifier 612 can be omitted from system 600 in some alternative examples.

In FIG. 6, a power amplifier 616 is coupled to receive and amplify the boosted signal from preamplifier 612 to produce an amplified output signal suitable to drive one or more speakers 620. In situations where preamplifier 612 is omitted from system 600, power amplifier 616 may be replaced with an integrated amplifier. The amplifiers and speakers of system 600 can be components of a user's device as described above. In some implementations, a display integral with the user's device or in the form of a separate device connected to the user's device can be controlled to display graphical data illustrating frequency bands of the output signal and other information characterizing the signal, such as the information presented in FIGS. 5A and 5B. In some other scenarios, amplifiers 612 and speakers 620 of FIG. 6 are parts of a public address (PA) system, theatrical or concert sound system, or a domestic system such as a stereo or home-theatre system.

The techniques described herein can be implemented by one or more computing devices. For example, a controller of a special-purpose computing device may be hard-wired to perform the disclosed operations or cause such operations to be performed and may include digital electronic circuitry such as one or more application-specific integrated circuits (ASICs) or field programmable gate arrays (FPGAs) persistently programmed to perform operations or cause operations to be performed. In some implementations, custom hard-wired logic, ASICs, and/or FPGAs with custom programming are combined to accomplish the techniques.

In some other implementations, a general purpose computing device can include a controller incorporating a central processing unit (CPU) programmed to cause one or more of the disclosed operations to be performed pursuant to program instructions in firmware, memory, other storage, or a combination thereof. Examples of general-purpose computing devices include servers, network devices and user devices such as smartphones, tablets, laptops, desktop computers, portable media players, other various portable handheld devices, and any other device that incorporates data processing hardware and/or program logic to implement the disclosed operations or cause the operations to implemented and performed. A computing device may include a monitor, printer, or other suitable display for providing any of the results mentioned herein to a user.

The terms "storage medium" and "storage media" as used herein refer to any media that store data and/or instructions that cause a computer or type of machine to operation in a specific fashion. Any of the models, modules, units, engines and operations described herein may be implemented as or caused to be implemented by software code executable by a processor of a controller using any suitable computer language. The software code may be stored as a series of instructions or commands on a computer-readable medium for storage and/or transmission. Examples of suitable computer-readable media include random access memory (RAM), read only memory (ROM), a magnetic medium such as a hard-drive or a floppy disk, an optical medium such as a compact disk (CD) or DVD (digital versatile disk), a solid state drive, flash memory, and any other memory chip or cartridge. The computer-readable medium may be any combination of such storage devices. Computer-readable media encoded with the software/program code may be packaged with a compatible device such as a user device or a server as described above or provided separately from other devices. Any such computer-readable medium may reside on or within a single computing device or an entire computer system, and may be among other computer-readable media within a system or network.

Storage media is distinct from but may be used in conjunction with transmission media. Transmission media participates in transferring information between storage media. For example, transmission media includes coaxial cables, copper wire and fiber optics. Transmission media can also take the form of acoustic or light waves, such as those generated during radio-wave and infra-red data communications.

Despite references to particular computing paradigms and software tools herein, the disclosed techniques are not limited to any specific combination of hardware and software, nor to any particular source for the instructions executed by a computing device or data processing apparatus. Program instructions on which various implementations are based may correspond to any of a wide variety of programming languages, software tools and data formats, and be stored in any type of non-transitory computer-readable storage media or memory device(s), and may be executed according to a variety of computing models including, for example, a client/server model, a peer-to-peer model, on a stand-alone computing device, or according to a distributed computing model in which various functionalities may be effected or employed at different locations. In addition, references to particular protocols herein are merely by way of example. Suitable alternatives known to those of skill in the art may be employed.

It should also be noted that the term "speaker" as used herein can include, by way of example only, loudspeakers incorporating a direct radiating electro-dynamic driver mounted in an enclosure, horn loudspeakers, piezoelectric speakers, magnetostrictive speakers, electrostatic loudspeakers, ribbon and planar magnetic loudspeakers, bending wave loudspeakers, flat panel loudspeakers, distributed mode loudspeakers, Heil air motion transducers, plasma arc speakers, digital speakers and any combination thereof.

While the subject matter of this application has been particularly shown and described with reference to specific implementations thereof, it will be understood by those skilled in the art that changes in the form and details of the disclosed implementations may be made without departing from the spirit or scope of this disclosure. Examples of some of these implementations are illustrated in the accompanying drawings, and specific details are set forth in order to provide a thorough understanding thereof. It should be noted that implementations may be practiced without some or all of these specific details. In addition, well known features may not have been described in detail to promote clarity. Finally, although advantages have been discussed herein with reference to some implementations, it will be understood that the scope should not be limited by reference to such advantages. Rather, the scope should be determined with reference to the appended claims.

The invention claimed is:

1. A method for dynamically adjusting thresholds of a compressor responsive to an input audio signal, the method comprising:

receiving an input audio signal having a plurality of frequency band components;

determining a plurality of time-varying thresholds according to the plurality of frequency band components, each time-varying threshold corresponding to a respective frequency band component;

performing, by a compressor, on each frequency band component, a compression operation having the corresponding time-varying threshold to produce a plurality of gains, each gain corresponding to a respective frequency band component;

applying each gain to a delayed corresponding frequency band component to produce a plurality of processed frequency band components;

summing the processed frequency band components to produce an output signal;

determining a time-varying estimate of a perceived spectrum of the output signal;

determining a time-varying estimate of a distortion spectrum induced by the perceived spectrum estimate;

predicting an audibility measure of the distortion spectrum estimate in the presence of the perceived spectrum estimate; and adjusting one or more of the time-varying thresholds according to the predicted audibility measure.

2. The method of claim 1, wherein the distortion spectrum estimate is determined according to a response of a distortion model to the perceived spectrum estimate.

3. The method of claim 2, wherein the distortion spectrum estimate comprises a first estimated distortion of a first frequency band component, the first estimated distortion determined as a maximum of distortion induced into the first frequency band component and into at least a portion of the frequency band components of higher frequency than the first frequency band component.

4. The method of claim 1, wherein determining the perceived spectrum estimate comprises:

applying a smoothing operation to the processed frequency band components.

5. The method of claim 1, wherein predicting the audibility measure of the distortion spectrum estimate in the presence of the perceived spectrum estimate comprises:

computing a masking threshold from the perceived spectrum estimate;

determining differences between the distortion spectrum estimate and the masking threshold; and summing positive values of the determined differences to produce the predicted audibility measure.

6. The method of claim 5, wherein the masking threshold is computed with reference to a tonality spectrum based on the perceived spectrum estimate, the tonality spectrum comprising tonality values differentiating noise-like frequency band components from tone-like frequency band components.

7. The method of claim 5, wherein the summed positive values of the determined differences are weighted such that one or more upper frequency band components and one or more lower frequency band components have lower weights than a frequency band component between the upper and lower band components.

8. The method of claim 1, wherein the time-varying thresholds are further determined according to a plurality of fixed thresholds.

9. The method of claim 8, wherein each time-varying threshold is determined according to a frequency band component and according to the plurality of fixed thresholds.

10. The method of claim 9, wherein each time-varying threshold is determined according to the corresponding frequency band component and according to a respective fixed threshold.

11. The method of claim 8, further comprising:
predicting an audibility measure of distortion;
normalizing the predicted audibility measure; and
raising or lowering one or more of the time-varying thresholds with reference to one or more of the fixed thresholds and according to the normalized audibility measure as applied to an offset value.

12. The method of claim 1, further comprising:
storing data of the output signal on a storage medium.

13. Apparatus for dynamically adjusting compression thresholds responsive to an input audio signal, the apparatus comprising:

one or more controllers operable to cause the operations recited in claim 1 to be performed.

14. The apparatus of claim 13, wherein the one or more controllers are further operable to cause one or more of the operations recited in claim 2 to be performed.

15. The apparatus of claim 13, further comprising:
a filtering module capable of filtering the input audio signal to produce the plurality of frequency band components.

16. The apparatus of claim 15, wherein the filtering module comprises:
a multi-band filter comprising a plurality of bandpass filters, each bandpass filter corresponding to a respective frequency band component.

17. The apparatus of claim 13, further comprising:
one or more amplifiers coupled to receive the output signal, the one or more amplifiers capable of amplifying the output signal to produce an amplified output signal; and
one or more speakers coupled to receive and play the amplified output signal.

18. The apparatus of claim 17, further comprising:
a display device coupled to receive the output signal or the amplified output signal, the display device capable of displaying graphical data associated with the received signal.

19. A non-transitory computer-readable storage medium storing instructions executable by a computing device to cause a method to be performed for dynamically adjusting thresholds of a compressor responsive to an input audio signal, the method comprising the operations recited in claim 1.

20. The non-transitory computer-readable storage medium of claim 19, wherein the method further comprises one or more operations recited in claim 2.